(12) United States Patent
Yedidia et al.

(10) Patent No.: US 6,771,197 B1
(45) Date of Patent: Aug. 3, 2004

(54) QUANTIZING SIGNALS USING SPARSE GENERATOR FACTOR GRAPH CODES

(75) Inventors: Jonathan S. Yedidia, Cambridge, MA (US); Emin Martinian, Arlington, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 0 days.

(21) Appl. No.: 10/672,919

(22) Filed: Sep. 26, 2003

(51) Int. Cl.$^7$ .............................................. H03M 7/00
(52) U.S. Cl. ...................... 341/107; 714/751; 714/752; 714/794
(58) Field of Search .................................. 341/170, 106, 341/76, 94, 50, 200; 714/746, 751, 752–759, 764, 794

(56) References Cited

U.S. PATENT DOCUMENTS

| | | | |
|---|---|---|---|
| 2003/0033570 A1 * | 2/2003 | Khannanov et al. | 714/755 |
| 2003/0037298 A1 * | 2/2003 | Eleftheriou et al. | 714/752 |
| 2003/0065989 A1 * | 4/2003 | Yedida et al. | 714/703 |
| 2003/0074626 A1 * | 4/2003 | Coker et al. | 714/752 |
| 2003/0079171 A1 * | 4/2003 | Coe | 714/758 |

OTHER PUBLICATIONS

R. Gray and D. Neuhoff, "*Quantization*," IEEE Transactions on Information Theory, vol. 44, pp. 2325–2383, Oct. 1998.
"A *Mathematical Theory of Communication*," Bell Syst. Tech. Journal, vol. 27, pp. 379–423, 623–656, 1948.
P. Oswald and A. Shokrollahi, "*Capacity–achieving Sequences for the Erasure Channel*," IEEE Transactions on Information Theory, vol. 48, pp. 3017–3028, Dec. 2002.
F.R. Kschischang, B.J. Frey, and H.–A. Loeliger, "*Factor Graphs and the Sum–Product Algorithm*," IEEE Transactions on Information Theory, vol. 47, pp. 498–519, Feb. 2001.
J. S. Yedidia, J. Chen, and M. Fossorier, "*Representing Codes for Belief Propagation Decoding*," Proceedings of the International Symposium on Information Theory, p. 176, 2003.
J.S. Yedidia, W.T. Freeman, and Y. Weiss, "*Constructing Free Energy Approximations and Generalized Belief Propagation Algorithms*," Mitsubishi Electric Research Laboratories, TR2002–35, Aug. 2002.

* cited by examiner

Primary Examiner—Brian Young
Assistant Examiner—John B Nguyen
(74) Attorney, Agent, or Firm—Dirk Brinkman

(57) ABSTRACT

A method quantizes an input signal of N samples into a string of k symbols drawn from a q-ary alphabet. A complementary method reproduces a minimally distorted version of the input signal from the quantized string, given some distortion measure. First, an $[N,k]_q$ linear error-correcting code that has a sparse generator factor graph representation is selected. A fixed mapping from q-ary symbols to samples is selected. A soft-input decoder and an encoder for the SGFG codes is selected. A cost function is determined from the input signal and a distortion measure, using the fixed mapping. The decoder determines an information block corresponding to a code word of the SGFG code with a low cost for the input signal. The input signal can be reproduced using the encoder for the SGFG code, in combination with the fixed mapping.

8 Claims, 6 Drawing Sheets

QUANTIZING SIGNALS USING SPARSE GENERATOR FACTOR GRAPH CODES

FIELD OF THE INVENTION

The present invention relates generally to the field of quantizing signals and reproducing quantized signals.

BACKGROUND OF THE INVENTION

A fundamental problem in the field of data storage and communication is the development of practical methods to quantize input signals, and then to reproduce the quantized signals with a minimal amount of distortion, see R. Gray and D. Neuhoff, "*Quantization*," IEEE Transactions on Information Theory, vol. 44, pp. 2325–2383, October 1998.

Methods for quantizing and reproducing signals are important parts of systems that store or transfer very large amounts of data, as commonly arise with audio, image, or video files, as well as signals acquired from large scale physical phenomena. These methods are particularly important for transferring large amounts of data over relatively slow communications networks, or storing large data sets in a limited amount of memory. Quantization is a form of lossy compression.

Quantization and Reproduction Problems

The problem of quantizing and reproducing a signal can be formulated as follows. An input signal includes N samples of data. The signal may represent images, videos, audio streams, or any other signal that can be represented by a set of numbers. The samples can be real-valued numbers, or numbers with a limited precision. For example, a sample can be a 16-bit number, which means that a sample can take one of $2^{16}$ possible values.

It is desired to quantize such a signal into a string of k symbols chosen from a q-ary alphabet. In practical applications, q is normally much less than the number of levels a sample can take. That is, the number of bits required to represent the symbol is normally less than the number of bits required to represent the sample. Furthermore, it is desired to use a quantization method such that the string of k symbols can later be reproduced into an output signal of N samples that is, on average, substantially similar to the input signal. That is, the quantizing and reproducing causes a minimal amount of distortion.

FIG. 1 shows summarizes the general form of the quantization and reproduction problem 100. A source produces an input signal 101 of N samples 102 that is to be quantized. The input signal x[n], where the index n runs over the N samples, is passed to a quantizer 110. The quantizer transforms the samples 102 to a string of k symbols s[a] 115. A reproducer 120 can later transform the symbols 115 to N samples 103 of an output signal z[n] 104, which is substantially similar to the input signal 101.

Illustrative Quantization and Reproduction Method

As an illustrative example, consider a case where the input signal includes N=4 samples, where each sample in the signal is a real number of three significant digits that are selected independently from a uniform probability distribution between 0.0 and 1.0. A typical signal would be {0.723, 0.238, 0.129, 0.678}. Suppose that one desires to quantize such signals to a string of k=2 symbols selected from an alphabet of q=4 symbols, e.g., the four letters A, B, C, and D.

An illustrative quantization method for this problem works as follows. First consider the first two samples in the signal, in this case 0.723 and 0.238. If they are both greater than or equal to 0.5, then assign the first letter of the quantized string to be A. If the first sample is greater than or equal to 0.5 but the second sample is less than 0.5, then assign the first letter to be B. If the first sample is less than 0.5 and the second sample is greater than or equal to 0.5, then assign the first letter to be C. Finally, if both the first and second samples are less than 0.5, then assign the first letter to be D. Use an identical rule to assign the second letter of the quantized string based on the values of the third and fourth samples of the signal. The signal {0.723, 0.238, 0.129, 0.678} is quantized to the string {B, C} using this method.

Together with the quantization method 110, one needs a compatible reproduction method 120 to reconstruct the input signal. A reasonable reproduction method compatible with the illustrative quantization method works as follows. If the first letter of the quantized string is an A, then assign the first two samples of the reproduced signal to be {0.75, 0.75}. If the first letter of the string is a B, then assign the first two samples of the reproduced signal to be {0.75, 0.25}. If the first letter is C, then assign the first two samples to be {0.25, 0.75}, and if the first letter is a D, then assign the first two samples to be {0.25, 0.25}. Use an identical rule to assign the third and fourth samples based on the second letter. For example, one would transform the string {B,C} to the reproduced signal {0.75, 0.25, 0.25, 0.75} using these rules.

Rate and Distortion

Two very important measures for any quantization/reproduction method are the rate of the method and the distortion caused by the method.

The rate R of the quantizer is the number of bits that are used per sample of the input signal. Because the information content of a single q-ary symbol is $\log_2(q)$ bits, the over-all rate of the quantizer is R=k $\log_2(q)/N$. The rate of the example quantizer above is 2 $\log_2(4)/4=1$ bit per sample. Clearly, one desires that the rate of a quantizer be as low as possible, so that a minimal number of bits are used to represent the input signal.

The distortion D is a measure of a difference between the input signal and the reproduced output signal. The distortion can be defined in many different ways, depending on which features of the input signal are considered important. If the samples in the input signal are real numbers, then one natural way to measure distortion is to average the sum the squares of the differences between the input and the output signals, i.e., to define the distortion to be $$D = \frac{1}{N}\sum_{n=1}^{N}(x[n] - z[n])^2.$$

This distortion measure is called a mean square error (MSE) distortion.

A more general form for a distortion measure, which is reasonable for most cases, is $$D = \frac{1}{N}\sum_{n=1}^{N}d(x[n], z[n]), \quad (1)$$

where d(a,b) measures a distance between two individual samples a and b.

One normally uses a distance measure such that $d(a,b) \geq 0$, and d(a,b)=0 when a=b. This guarantees that the distortion is non-negative, and equal to zero when the output signal z[n] is identical to the input signal x[n].

Good quantization and reproduction methods minimize both the distortion and the rate. However, it is inevitable that there is a trade-off between the rate and the distortion. In general, a greater rate permits a lower distortion.

Optimal Rate-Distortion Function

A quantization problem can be defined by the probability distribution of the input signal and the distortion measure. For some quantization problems, it is possible to explicitly determine a formula giving the optimal distortion as a function of the rate. This idea dates to Shannon's original papers introducing information theory, see C. E. Shannon, "A Mathematical Theory of Communication," Bell Syst. Tech. Journal, vol 27, pp. 379–423, 623–656, 1948, and C. E. Shannon, "Coding Theorems for a Discrete Source with a Fidelity Criterion," IRE Nat. Conv. Rec., Pt. 4, pp. 142–163, 1959.

Shannon proved that the optimal rate-distortion function, i.e., the optimal distortion, given a particular rate, or vice versa, is given by a formula that depended only the input probability distribution and the distortion measure, see T. Cover and J. Thomas, "Elements of Information Theory," John Wiley & Sons, New York, 1991, for a detailed discussion of this theory. A detailed understanding of Shannon's formula is not necessary. The important point is simply that there is an optimal rate-distortion limit for any quantization problem.

One quantization problem where the optimal rate distortion function can be computed more explicitly is the case when the samples of the signal are selected independently from a Gaussian distribution, and the distortion measure is the MSE distortion.

A major problem with prior art methods of quantization and reproduction is that none of them achieve performance at the optimal rate-distortion limit for this problem. For example, when quantizing an input signal produced from a Gaussian source relative to MSE distortion, the entropy coded scalar quantization (ECSQ) method is 1.5–3.4 dB away from the Shannon rate-distortion limit, depending on the rate, see R. Gray and D. Neuhoff, "Quantization," IEEE Transactions on Information Theory, vol. 44, pp. 2325–2383, October 1998.

For this problem, trellis coded quantization (TCQ) using a 256-state code with optimal quantization is 0.5–1.4 dB from the optimal rate-distortion limit, see M. Marcellin and T. Fischer, "Trellis Coded Quantization of Memoryless and Gauss-Markov Sources," IEEE Transactions on Communications, vol. 38, pp. 82–93, 1990.

Prior art methods of quantization and reproduction are similarly unable to achieve the optimal rate-distortion limit for any other non-trivial quantization problem.

Binary Erasure Quantization Problem

Another quantization problem for which the optimal rate-distortion function can be explicitly computed is called the binary erasure quantization (BEQ) problem. In the BEQ problem, the input signal $x[n]$ is a sequence of N samples, where each sample can take on three possible values, denoted by '0', '1', and '*'. The '*' value can be thought of as an "erasure" or "don't care" symbol.

Each sample in $x[n]$ is independently chosen to be an erasure '*' with probability $p_e$, and chosen to be a '1' or '0' with probability $(1-p_e)/2$.

The signal $x[n]$ is quantized into a string of k bits $s[a]$. Because q=2 for this problem, the rate of the quantizer is therefore R=k/N.

The string $s[a]$ is ultimately transformed into a reproduced output signal $z[n]$. The output signal $z[n]$ is a sequence of '0' and '1' samples. The distortion measure in the BEQ problem is $$D = \frac{1}{N}\sum_{n=1}^{N} d(x[n], z[n]), \quad (2)$$

where $d(a,b)=0$ if $a=*$ or $a=b$, and $d(a,b)=1$ otherwise.

For this problem, the optimal rate-distortion function can be determined using Shannon's rate-distortion formulation. One finds, in particular, that if one demands zero distortion (D=0), then the optimal rate is $R=1-p_e$.

The following is a more intuitive explanation of the BEQ problem. One is given a random input signal of N samples, where one wants to make sure that some of the samples, e.g., the '0' and '1' samples, are reproduced precisely, while other samples, e.g., the '*' samples, can be replaced with either a '0' or '1'.

Of course, one does not know before one receives the signal, which samples are important and which samples are erasures, and, furthermore, the quantizer must work for any input signal.

One measures the amount of distortion in terms of how many of the '0' or '1' samples are reproduced incorrectly. According to the optimal rate-distortion function, one can typically quantize the input signal down to a string of k symbols, where k is just the average number of '0' and '1' samples in the original signal, without suffering any distortion.

Binary Symmetric Quantization Problem

Another quantization problem that is useful for illustrative purposes is the binary symmetric quantization (BSQ) problem. In the BSQ problem, the input signal $x[n]$ is a sequence of N samples, where each sample can take only two possible values, denoted by '0', '1'. Each sample in $x[n]$ is independently chosen to be a '1' with probability ½, and chosen to be a '0' with probability ½.

The signal $x[n]$ is quantized into a string of k bits $s[a]$. The string $s[a]$ is transformed into a reproduced output signal $z[n]$. The output signal $z[n]$ is a sequence of '0' and '1' samples. The distortion measure in the BEQ problem is $$D = \frac{1}{N}\sum_{n=1}^{N} d(x[n], z[n]), \quad (2)$$

where $d(a,b)=0$ if $a=b$, and $d(a,b)=1$ otherwise.

For the BSQ problem, the optimal rate-distortion function is also determined according to the Shannon's rate-distortion theory. For example, for a quantizer of rate ½, one finds that the minimal distortion possible is approximately 0.11.

Both the BEQ and BSQ problems are somewhat unrealistic for practical applications, in that the number of possible sample values is so small. However, they are still useful for illustrating the quantizing and reproducing problem.

Linear Block Error-Correcting Codes

The invention uses linear block error correcting codes in an unconventional way. Therefore, the following is intended to provide the necessary background information about such linear block error-correcting codes. Blahut, "Algebraic Codes for Data Transmission," Cambridge University Press: Cambridge, 2003, and MacWilliams et al., "The Theory of Error-Correcting Codes," North-Holland: New York, N.Y., 1977 are excellent textbooks about error-correcting codes.

Any references to "codes" herein specifically mean linear block error-correcting codes. The basic idea behind these codes is to encode a string of k symbols using a string of N symbols, where N>k. In the conventional application of error-correcting codes, the additional N–k bits are used to decode and correct corrupted messages.

An arbitrary string of N symbols is also sometimes called a "block" or a "word." A block of N symbols that satisfies all the constraints of the code is called a "code-word." The symbols are drawn from a q-ary alphabet. A very important special case is when q=2. In that case, the code is a "binary" code.

FIG. 2 shows a conventional channel coding method 200 that uses a linear block error-correcting code. A source 201 produces a string s[a] containing k symbols 202, where the symbols are drawn from a q-ary alphabet. The string is passed to an encoder 210 of the error-correcting code, and is transformed into a code word x[n] including N symbols 203.

The code words 203 are then transmitted through a channel 215, where they are corrupted into the signal y[n] 204. The corrupted signal y[n] 204 is then passed to a decoder 220, which outputs a reconstruction 205 of the code word x[n], or equivalently an output signal 206 in the form of a k-symbol string s[a] similar to the input signal, if the additive noise in the channel is not too large.

Parameters of Codes

A code C is defined by a set of $q^k$ possible code words having a block length N. The parameter k is sometimes called the "dimension" of the code. Codes are normally much more effective when N and k are large. However, as the size of the parameters N and k increases, so does the difficulty of decoding corrupted messages.

The "rate" R of a code is defined by R=k $\log_2$ (q)/N.

The Hamming distance between two code words is defined as the number of symbols that differ in the two words. The distance d of a code is defined as the minimum Hamming distance between all pairs of code words in the code. Codes with a larger value of d have a greater error-correcting capability. Codes with parameters N, k, and q are referred to as $[N,k]_q$ codes. If the distance d is also known, then they are referred to as $[N,k,d]_q$ codes.

Galois Fields

Linear codes are usually represented in terms of generator and parity check matrices. To define these matrices, one first needs a way to add and multiply q-ary symbols. The theory of finite fields, which are also called Galois fields, provides a way to define addition and multiplication over q-ary symbols. See any textbook on error-correcting codes, including the ones already referenced or S. Lin and D. Costello, *"Error Control Coding: Fundamentals and Applications,"* Prentice Hall: Englewood Cliffs, N.J., 1983, for a detailed explanation of Galois fields.

In a Galois field, when any two symbols from a q-ary alphabet are added or multiplied together, the answer is an element from the same alphabet. There is a multiplicative and additive id entity element, and each element has a multiplicative and additive inverse, except that the additive identity element has no multiplicative inverse.

Galois fields are denoted GF(q), where q is the number of elements in the alphabet. A Galois field can be defined in terms of its addition and multiplication tables. The simplest Galois field is GF(2), which has two elements 0 and 1, where 0 is the additive identity and 1 is the multiplicative identity. The addition rules for GF(2) are 0+0=1+1=0, and 0+1=1+0=1, and the multiplication rules for GF(2) are 0*0=0*1=1*0=0, and 1*1=1.

GF(3) has three elements 0, 1, and 2, where 0 is the additive identity, 1 is the multiplicative identity, and the addition rules are 0+0=1+2=2+1=0, 0+1=1+0=2+2=1, 0+2= 1+1=2+0=2, and the multiplication rules are 0*2=1*0=2*0= 0; 1*1=2*2=1, 1*2=2*1=2.

Galois fields can be defined for any q that is a prime number or an integer power of a prime number. The addition and multiplication rules for any Galois field can be derived from the theory described in textbooks on error-correcting codes referenced previously.

All sums and multiplications of q-ary symbols mentioned herein should be assumed to be sums and multiplications using the rules of GF(q).

Generator Matrix Representations of Codes

A block code is "linear" when the sum of any two code words is also a code word. The sum of two code words of N symbols each is defined to be the code word of N symbols, obtained by summing the individual symbols one at a time. For example the sum of the two code words 1110100 and 0111010 using GF(2) is 1001110.

A linear code can be compactly represented by a generator matrix. In fact, many different generator matrices can represent the same linear code.

A generator matrix representing an $[N, k]_q$ code is a matrix of L rows and N columns, where each element in the matrix is a q-ary symbol. The N columns of the matrix correspond to the N symbols in a code word. The generator matrix contains k linearly independent rows. If L>k, then some of the rows of the generator matrix are redundant. All the code words in a code can be obtained by taking linear combinations of the rows of a generator matrix.

An illustrative example of a generator matrix is the following matrix for an $[N=4, k=2, d=3]_{q=3}$ code known as the "tetra-code":

$$G = \begin{pmatrix} 1 & 0 & 1 & 1 \\ 0 & 1 & 1 & 2 \end{pmatrix}. \tag{3}$$

The tetra-code has block-length N=4, and the number of code words is $q^k=9$.

As another example, the following is a generator matrix of the $[N=7, k=4, d=3]_{q=2}$ binary Hamming code:

$$G = \begin{pmatrix} 1 & 0 & 1 & 1 & 0 & 0 & 0 \\ 0 & 1 & 0 & 1 & 1 & 0 & 0 \\ 0 & 0 & 1 & 0 & 1 & 1 & 0 \\ 0 & 0 & 0 & 1 & 0 & 1 & 1 \end{pmatrix}. \tag{4}$$

Encoders for Error-correcting Codes

An encoder 210 for a linear $[N, k]_q$ code transforms the string of k symbols 202 into a code word of N symbols 203. A string of k symbols that is thus transformed into $q^k$ different code words is referred to as an "information block," and the symbols in the information block are referred to as "information symbols." Encoders can be constructed using the generator matrix for a code.

More specifically, suppose one has an information block s[a], and one desires to construct an N symbol code word y[n] for the code generated by the generator matrix G. Encoding can be done using the equation $$y[n] = \sum_{a=1}^{k} G[a, n]s[a], \tag{5}$$

where G[a,n] is the value of the symbol in the matrix G in the $a^{th}$ row and $n^{th}$ column. For example, consider the tetra-code, as represented by the generator matrix given in equation (3). If the information block is {1,2}, then the corresponding code word is 1011+2*0112=1011+0221= 1202, using the rules of addition and multiplication for GF(3). In all, the 9 code words of the tetra-code are 0000, 1011, 2022, 0112, 1120, 2101, 0221, 1202, and 2210.

Notice that the all-zeros word is always a code word of a linear code, obtained when all the symbols in the information block equal zero.

Parity Check Matrix Representations of Codes

Linear codes can also be represented by parity check matrices. The parity check matrix representing an $[N, k]_q$ code is defined by a matrix of q-ary symbols, with M rows and N columns. The N columns of the parity check matrix correspond to the N symbols of the code. The number of linearly independent rows in the matrix must be k.

Each row of the parity check matrix represents a constraint. The symbols involved in the constraint represented by a particular row correspond to the columns that have a non-zero symbol in that row. The parity check constraint forces the weighted sum, over GF(q), of those symbols to be equal to zero. For example, for a binary code, the parity check matrix $$H = \begin{bmatrix} 1 & 1 & 1 & 0 & 1 & 0 & 0 \\ 0 & 1 & 1 & 1 & 0 & 1 & 0 \\ 0 & 0 & 1 & 1 & 1 & 0 & 1 \end{bmatrix} \quad (6)$$

represents the three constraints $$y[1]+y[2]+y[3]+y[5]=0 \quad (7)$$

$$y[2]+y[3]+y[4]+y[6]=0 \quad (8)$$

$$y[3]+y[4]+y[5]+y[7]=0, \quad (9)$$

where y[n] is the value of the $n^{th}$ bit. This parity check matrix is another way to represent $[N=7, k=4, d=3]_{q=2}$ Hamming code represented by the generator matrix given in equation (4).

If a code is represented by a generator matrix G and a parity matrix H, then its dual code is the code for which H is a generator matrix.

Decoders for Error-Correcting Codes

A decoder 220 for a linear $[N, k]_q$ code transforms a distorted version x[n] of a transmitted code word 203 into a code word y[n] 205. Because there is a one-to-one mapping between a code word y[n] and the information block s[a] that is encoded into y[n], one can also think of a decoder as transforming x[n] into an information block s[a].

The distorted version of the transmitted code word is sometimes a word x[n] whose samples take values from the same q-ary alphabet as the error-correcting code. Decoders that accept such input signals are often referred to as "hard-input" decoders. Such decoders are useful when the channel corrupts q-ary symbols in the code word to other q-ary symbols with some small probability. An optimal hard-input decoder for such channels outputs the code word y[n] that has the smallest distance from x[n].

Alternatively, the signal x[n] can first be transformed into a "cost function," then the cost function is input to the decoder. A cost function is a vector specifying a cost for each possible state of each symbol.

Decoders that accept such input cost functions are often referred to as "soft-input" decoders. For a binary code with block-length 3, an example cost function for a soft-input decoder is [(0.1, 0.3), (0.2, 0.4), (0.25, 0.15)]. This cost function means that the cost of assigning the first bit the value '0' is 0.1, the cost of assigning the first bit the value '1' is 0.3, the cost of assigning the second bit the value '0' is 0.2, and so on.

An optimal soft-input decoder returns a code word y[n] that has a lowest possible summed cost, given the cost function. For example if the 3-bit code of the example in the previous paragraph had the two code words 000 and 111, then the code word 000 is returned, because it has a cost of 0.1+0.2+0.25=0.55, while the code word 111 has a cost of 0.3+0.4+0.15=0.85.

The cost in a soft-input decoder is often taken to be equal to the negative of the log-likelihood for each bit, given the received signal and the channel model. Thus, optimal decoders are often referred to as "maximum likelihood" decoders, because minimizing the cost corresponds to maximizing the likelihood.

Constructing optimal hard-input or soft-input decoders for error-correcting codes is generally a much more complicated problem then constructing encoders for error-correcting codes. The problem becomes especially complicated for codes with large N and k. For this reason, many decoders used in practice are not optimal. Non-optimal hard-input decoders attempt to determine the closest code word to the received word, but are not guaranteed to do so, while non-optimal soft-input decoders attempt to determine the code word with a lowest cost, but are not guaranteed to do so.

Limits on the Optimal Performance of Codes

Information theory gives important limits on the possible performance of optimal decoders. Some of these results were first proven by C. E. Shannon, in "*A Mathematical Theory of Communication*," Bell Syst. Tech. Journal, vol 27, pp. 379–423, 623–656, 1948. R. Gallager, "*Information Theory and Reliable Communication*," John Wiley & Sons, New York 1968 is a further reference textbook on this subject.

Expressed in intuitive terms, Shannon showed that any noisy channel has a capacity C that is related to its noisiness, and that optimal decoders of optimal codes can correct all errors if and only if the capacity is greater than the rate of the code.

An example of a noisy channel is the binary erasure channel (BEC). This channel is a two-input and three-output channel, where the inputs are bits that take the values '0' or '1,' and the outputs take the values '0,' '1,' or '?,' where a '?' denotes an erasure. Each '0' or '1' input bit passes through the channel unchanged with probability $1-p_e$, and is transformed into an '?', i.e., it is erased, with probability $p_e$. It is possible to show, using Shannon's theory, that the capacity of the BEC is $1-p_e$.

This means that if one is using a binary erasure channel where half the bits are erased on average, then one can correct all erasures by using an error-correcting code with a rate that is less than 0.5.

For many years, Shannon's limits seemed to be only of theoretical interest, as practical error-correcting coding methods were very far from the optimal performance. Very recently, however, error-correcting methods that used belief propagation decoders and irregular low-density parity check codes were shown to be capable of achieving results at or extremely close to the Shannon limit. Belief propagation decoders and low-density parity check codes are explained in more detail below.

For the BEC, Oswald et al. showed that irregular low-density parity check codes that were decoded using a belief propagation decoder can achieve the Shannon limit, see P. Oswald and A. Shokrollahi, "*Capacity-achieving Sequences for the Erasure Channel*," IEEE Transactions on Information Theory, vol. 48, pp. 3017–3028, December 2002. For an additive white Gaussian noise (AWGN), Chung, et. al. showed by simulations that one could use similar codes and decoders to obtain bit error rates of $10^{-5}$ within 0.0045 dB of the Shannon limit, see S.-Y. Chung, G. Forney, T.

Richardson, and R. Urbanke, "*On the Design of Low-Density Parity-Check Codes Within 0.0045 dB of the Shannon Limit*," IEEE Communications Letters, vol. 5, pp. 58–60, February 2001.

Counter intuitively, it is important to understand that using non-optimal decoders is a key ingredient to closely approaching the Shannon limit for the channel coding problem. The explanation of this apparent paradox is that to approach the Shannon limit, codes of very large blocklength and dimension must be used. Such long codes cannot normally be practically decoded using optimal decoders.

There are exceptional long codes that can be decoded optimally, but such codes always have other serious defects such as very poor minimal distance between their code words.

The small non-optimality of belief propagation decoders turns out to be relatively unimportant compared to the advantage gained by being able to use very long low-density parity check codes.

Low Density Parity Check Codes

A very important class of codes, low density parity check (LDPC) codes, were described by R. Gallager in "*Low Density Parity Check Codes*," MIT Press, Cambridge, 1963. The defining characteristic of such codes is that their parity check matrix has a low density of non-zero elements.

In the original LDPC codes described by Gallager, each row of the parity check matrix defining the code has the same number of non-zero elements. These codes are sometimes called "regular" LDPC codes. In an irregular LDPC code, the different rows of the parity check matrix can have different numbers of non-zero elements.

Gallager also introduced two classes of decoding methods for large block-length LDPC codes. One method, which he called "probabilistic decoding," is also often referred to as "sum-product decoding" or "belief propagation decoding." The other method is a so-called "bit-flipping" method. Neither of these decoding methods is optimal, but, as mentioned previously, the belief propagation decoding method is sufficiently close to optimal that it can be used to decode large irregular LDPC codes at very close to the Shannon limit.

Many methods have been explored recently to create good LDPC codes. For an introductory review of the literature, see T. Richardson and R. Urbanke, "*The Renaissance of Gallager's Low-Density Parity Check Codes*," IEEE Communications Magazine, pp. 126–131, August 2003.

Factor Graphs

As shown in FIG. 3, codes can be represented by bipartite graph 300 that is called a "factor graph," see F. R. Kschischang, B. J. Frey, and H.-A. Loeliger, "*Factor Graphs and the Sum-Product Algorithm*," IEEE Transactions on Information Theory, vol. 47, pp. 498–519, February 2001, G. D. Forney, Jr., "*Codes on Graphs: Normal Realizations*," IEEE Transactions on Information Theory, vol. 47, pp. 520–549, February 2001, and R. M. Tanner, "*A Recursive Approach to Low-Complexity Codes*," IEEE Transactions on Information Theory, vol. 27, pp. 533–547, September, 1981.

A factor graph is a bipartite graph, containing two types of nodes, called "variable nodes" and "factor nodes." Variable nodes 302 are only connected to factor nodes 301 and vice-versa. Factor nodes are conventionally drawn using squares 301, and variable nodes are conventionally drawn using circles 302, and connections between variable and factor nodes are denoted by lines 303 connecting the corresponding circles and squares. Sometimes a symbol, i.e., '+', is drawn inside a factor node to represent the kind of constraint that it enforces.

The variable nodes represent the symbols that are used in the code, and the factor nodes represent the constraints on the symbols. A variable node is only connected to a factor node if it is subject to the corresponding constraint.

The simplest factor graph representations of codes are those that correspond to a parity check matrix representation. In such factor graphs, there are N variable nodes that correspond to the N columns of the parity check matrix, and there are M factor nodes that correspond to the M rows of the parity check matrix. For example, the binary code with parity check matrix $$H = \begin{pmatrix} 1 & 1 & 0 \\ 0 & 1 & 1 \end{pmatrix} \tag{10}$$

has a corresponding factor graph representation shown in FIG. 3. In this factor graph representation, the only variable nodes are those that correspond to N symbols in a code word, and the factor nodes all correspond to parity check constraints.

More general factor graph representations of codes are possible. In particular, the set of variable nodes sometimes also includes nodes, called "state variable nodes" that help define the code, but are not one of the N symbols in a code word.

Sometimes, the factor nodes also represent constraints that are more general than a parity check constraint. For example, a factor node can represent a constraint such that the only acceptable configurations of the variable nodes that connect to it are those that correspond to a code word of some small code. In this way, large codes can be built recursively out of small codes, see R. M. Tanner, "*A Recursive Approach to Low-Complexity Codes*," IEEE Transactions on Information Theory, vol. 27, pp. 533–547, September 1981.

Sparse Generator Factor Graph Representations of Codes

A factor graph representation of a code is called "sparse" when each factor node is only connected to a relatively small number of variable nodes, and vice versa.

The factor graphs that correspond to the parity check matrices of LDPC codes are inherently sparse because of the low-density property of the parity check matrices of LDPC codes.

Other linear codes can also sometimes be represented by sparse generator factor graph representations. For example, Reed-Muller codes and other codes based on finite geometries can be represented by sparse factor graphs, see G. D. Forney, Jr., "*Codes on Graphs: Normal Realizations*," IEEE Transactions on Information Theory, vol. 47, pp. 520–549, February 2001; and J. S. Yedidia, J. Chen, and M. Fossorier, "*Representing Codes for Belief Propagation Decoding*," Proceedings of the International Symposium on Information Theory, p. 176, 2003.

Belief Propagation Decoding

Often, a belief propagation decoding method can be applied effectively to codes that can be represented by sparse factor graphs. The belief propagation decoding method is a non-optimal soft-input decoding method, but the degree of non-optimality is generally quite small when applied to a sparse factor graph representation of a code.

There are many different versions of belief propagation decoders, see F. R. Kschischang, B. J. Frey, and H.-A. Loeliger, "*Factor Graphs and the Sum-Product Algorithm*," IEEE Transactions on Information Theory, vol. 47, pp. 498–519, February 2001, and the other articles in the Special Issue on Codes and Graphs and Iterative Algorithms, IEEE Transactions on Information Theory, vol. 47, February 2001.

There are also decoders based on "generalized belief propagation," see J. S. Yedidia, W. T. Freeman, and Y. Weiss, "*Constructing Free Energy Approximations and Generalized Belief Propagation Algorithms,*" Mitsubishi Electric Research Laboratories, TR2002-35, August 2002.

Those decoders are all based on the idea that "messages" are passed between variable nodes and factor nodes. A special class of messages, corresponding to the cost function of the code, also sometimes called the "evidence," is also sent to each variable node. A variable node updates continually the messages that the node sends to factor nodes, and vice-versa, based on specified and pre-determined update rules. The update rules relate an outgoing message at a node or group of nodes to the incoming messages at the same node or group of nodes.

A "belief" that a variable node is in one of its possible states can then be determined from the messages arriving at that variable node, and the evidence. The "belief" is normally represented as a q-ary vector. The vector contains estimated probabilities that each of the q possible values of a variable node is the correct one. The decoder ultimately selects the state of each symbol by picking the symbol value whose belief has a highest probability.

Dual Relationship Between Channel Coding and Quantization Problems

Surprisingly, the channel coding problem and the quantization and reproduction problem are very closely related to each other. For example, it is striking that the BEQ problem and BEC model are very similar, and the optimal rate for a quantizer for the quantization problem is identical as the optimal rate for a code for the channel coding problem.

However, up to now, there are no known methods that allow one to approach the optimal limits for the quantization and reproduction problem, in the way that the optimal limits for the channel coding problem are approached using LDPC codes.

SUMMARY OF THE INVENTION

The present invention provides a method for quantizing an input signal of N samples into a string of k symbols drawn from a q-ary alphabet. In addition, the invention provides a corresponding method to reproduce the input signal from the quantized string so that the output signal of the reproduction is minimally distorted with respect to the input signal.

During initialization, the following elements are selected.

An $[N,k]_q$ code for the quantizing and reproduction methods is selected. The code has a sparse generator factor graph (SGFG) representation. Therefore, the selected code is referred to as a sparse generator factor graph (SGFG) code.

A fixed function is selected that maps q-ary symbols into sample values.

A soft-input decoding method for the SGFG code is selected. The preferred decoder uses belief propagation. However other decoders are also possible.

An encoding method for the SGFG code is selected.

Then, the quantizer processes the input signal as follows.

A cost function is determined from the input signal, a pre-determined distortion measure, and the function mapping q-ary symbols into sample values.

The cost function is decoded to a code word with a low cost. Then, the information block of the code word is selected to produce a corresponding information block of k symbols.

The reproduction method is based on the selected encoder for the SGFG code. When reproduction of the quantized signal is desired, the quantized string is first transformed into a corresponding code word using the encoder. Then, the code word is converted to an output signal of N symbols using the function mapping q-ary symbols into sample values.

The reproduced output signal is substantially similar to the input signal.

DETAILED DESCRIPTION OF THE PREFERRED EMBODIMENTS

Figure 1:
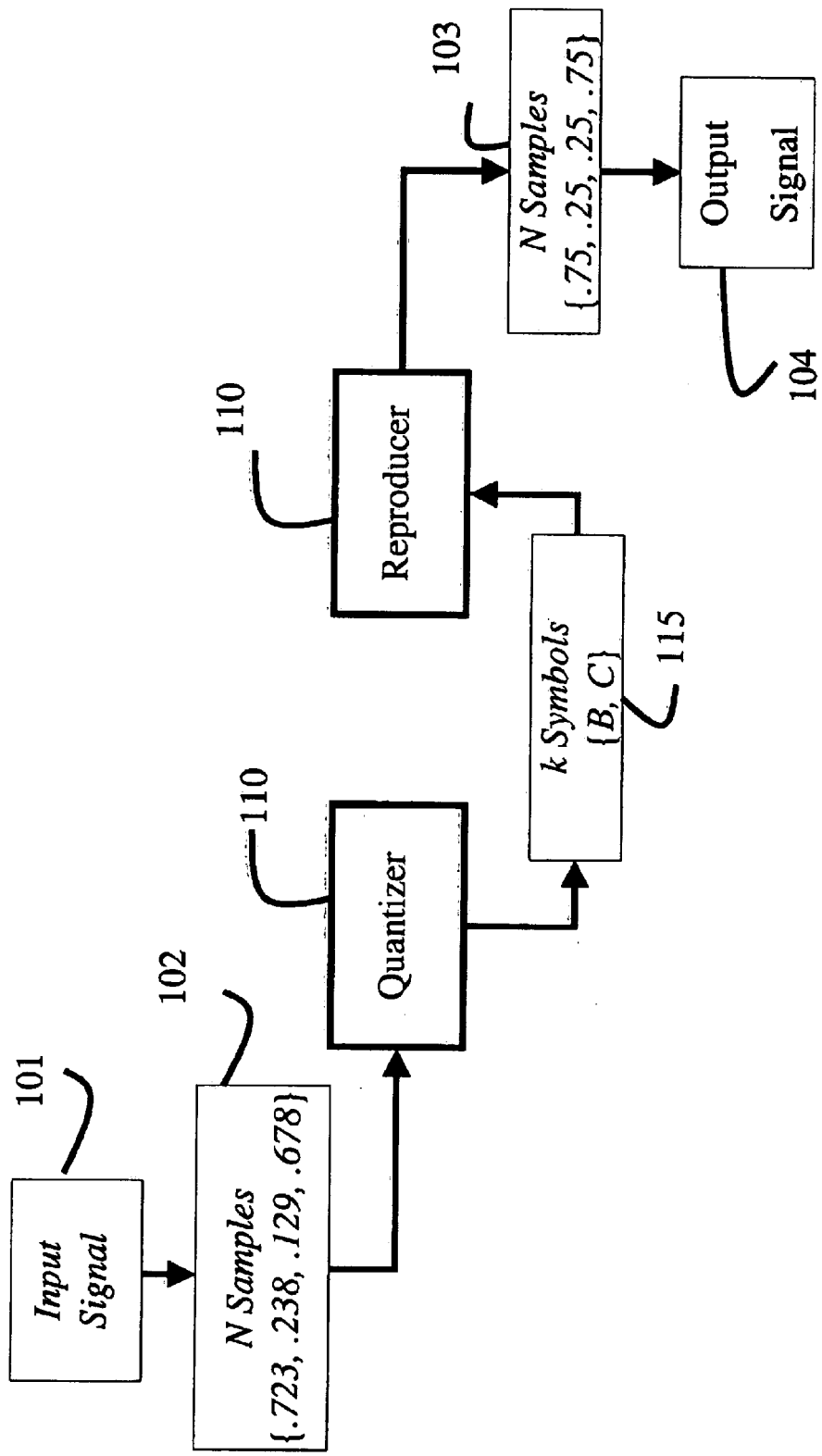
FIG. 1 is a block diagram of a prior art quantization and reproduction method.
Figure 2:
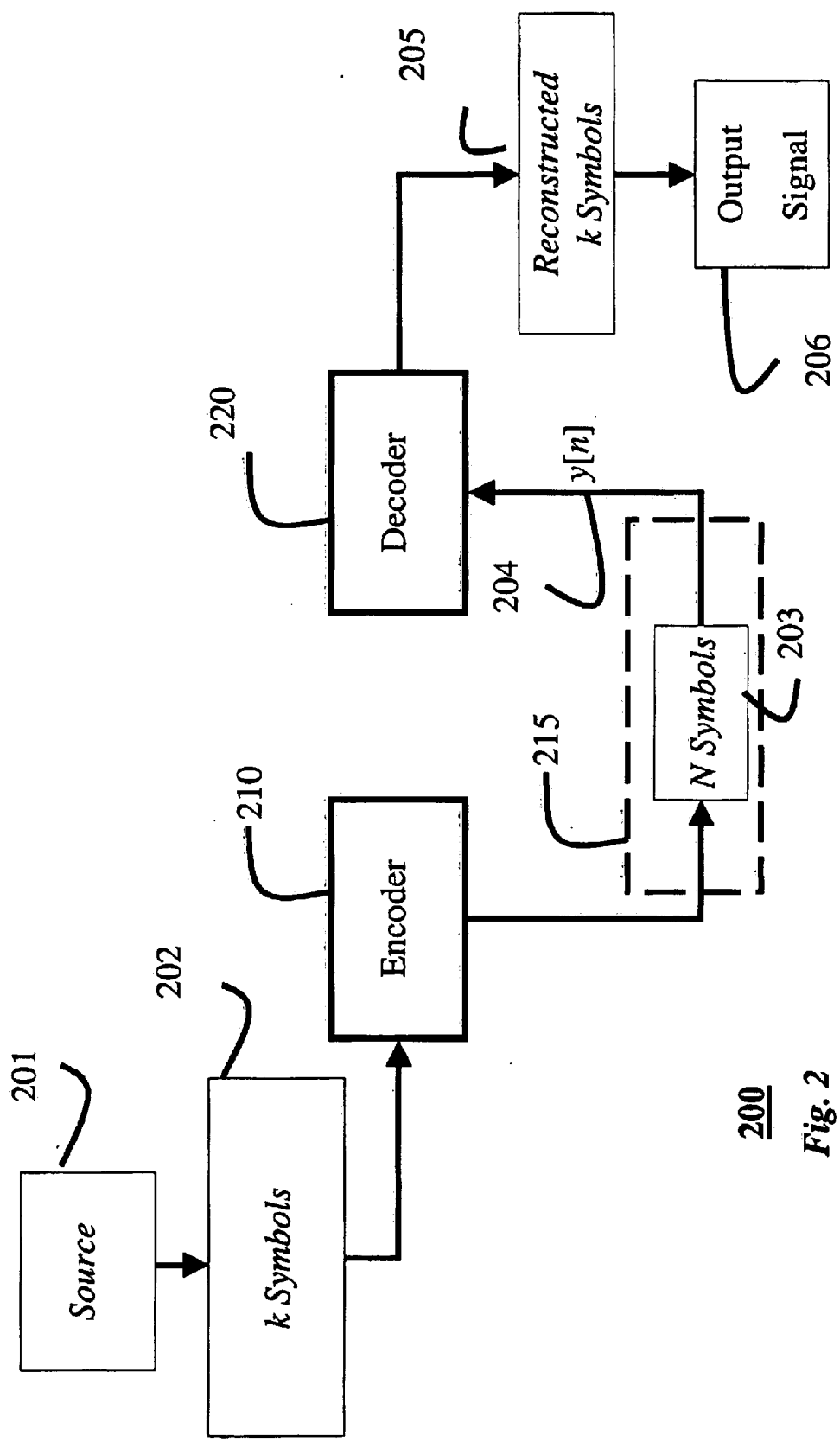
FIG. 2 is a block diagram of a prior art channel coding method.
Figure 3:
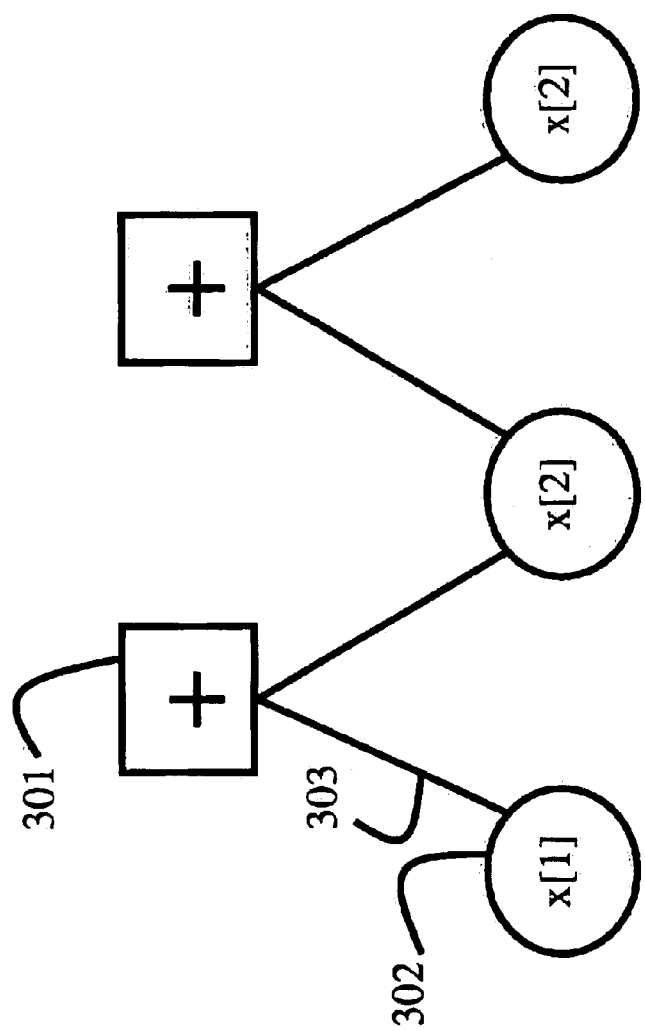
FIG. 3 is a prior art factor graph corresponding to a parity check matrix.
Figure 4:
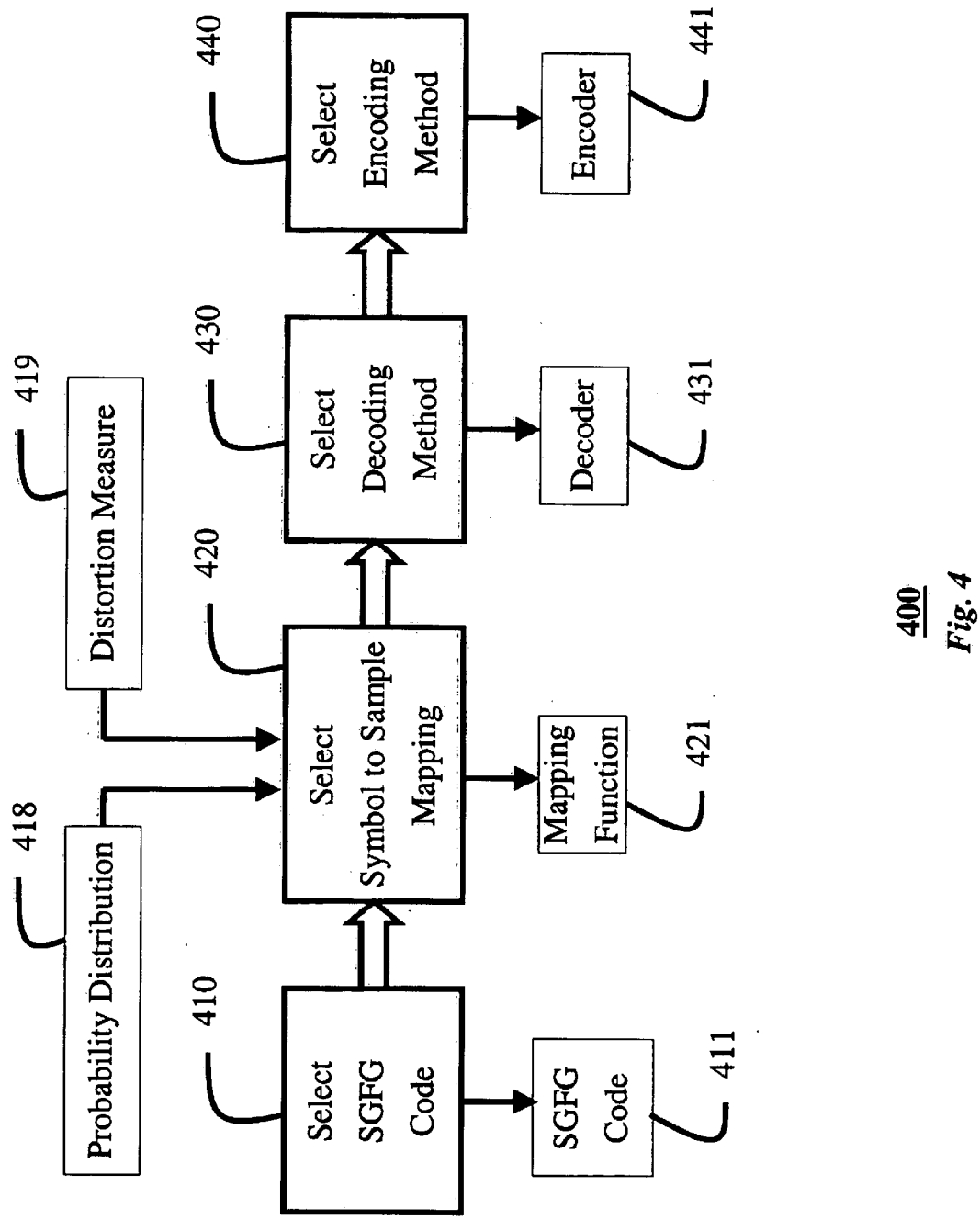
FIG. 4 is a flow diagram of an initialization procedure according to the invention.
Figure 5:
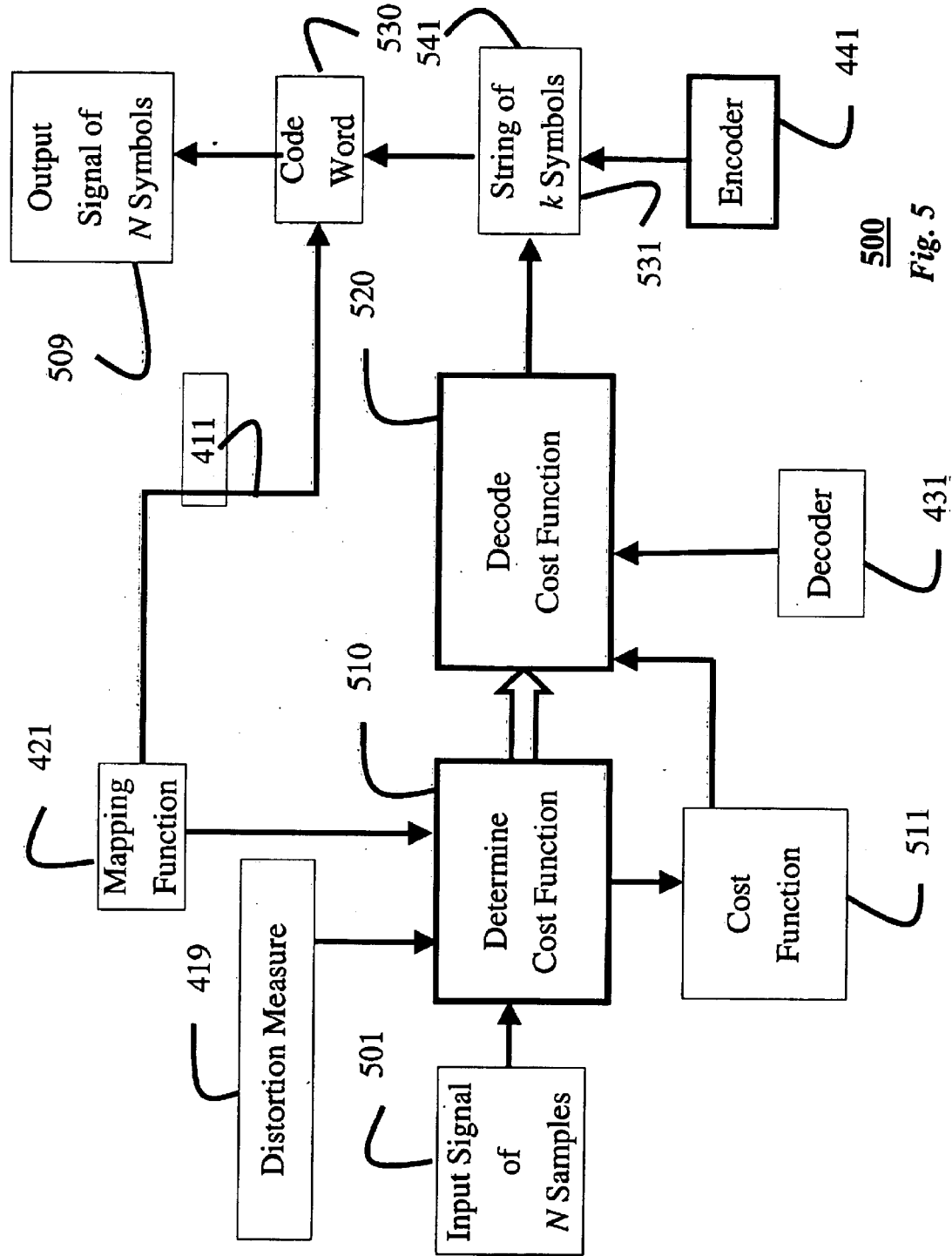
FIG. 5 is a flow diagram of a quantization procedure according to the invention.

FIG. 4 shows the steps of an initialization procedure 400 according to our invention. FIG. 5 shows the steps of the quantization and reproduction methods according to the invention. As a novel feature, our methods use a sparse generator factor graph code.

Parameters

An input signal 501 includes N samples. We desire to quantize the input signal into a string of k symbols selected from a q-ary alphabet. A reproduced output signal also has N samples. A distortion measure between the input signal and the reproduced output signal is known, and has the form of equation (1).

In the preferred embodiment of the invention, N is a large number, of the order of a thousand or larger. To make our examples manageable, we use examples with a smaller N. The reason that a large value for N is preferred is that large block-length quantizers can approach the optimum Shannon rate-distortion limit described above. An important point is that to approach the optimal limits for the channel coding problem, codes of large block-length are used, and similarly, to achieve the optimal limits of the quantization and reproduction problem, quantizers that quantize long signals are used.

Selecting a Code with a Sparse Generator Factor Graph Representation

We begin the initialization by selecting 410 an $[N, k]_q$ code 411 with a sparse generator factor graph (SGFG) representation.

To make clear what we mean, we first define a "generator factor graph" for a code. A generator factor graph for an $[N,k]_q$ code is a factor graph satisfying the following conditions. First, the generator factor graph contains at least N variable nodes, such that N of the variable nodes correspond to the symbols used to define a code word. Second, k variable nodes correspond to an information block for the code. Third, if the values of the k variable nodes corresponding to the information block are specified, one is able to uniquely determine the values of the N variable nodes corresponding to the code word. A sparse generator factor graph is a generator factor graph that is also sparse. We call a code represented by the sparse generator factor graph a sparse generator graph (SGFG) code 411.

One example of a code that has a SGFG representation is a code that is dual to a low density parity check (LDPC) code. Because such a code has a low-density generator matrix, we call the code a low-density generator matrix (LDGM) code.

An $[N, k]_q$ LDGM code has a generator matrix representation such that the generator matrix has N columns and M rows, of which k rows are linearly independent. Symbols in the generator matrix are selected from a q-ary alphabet, which is manipulated according to the rules of the Galois field GF(q), as described above.

Each row of the generator matrix of an LDGM code has a small number of non-zero symbols, typically of order ten or less. The generator matrix is formed using any of the many methods that are known in the literature for forming parity check matrices for LDPC codes.

Figure 6:
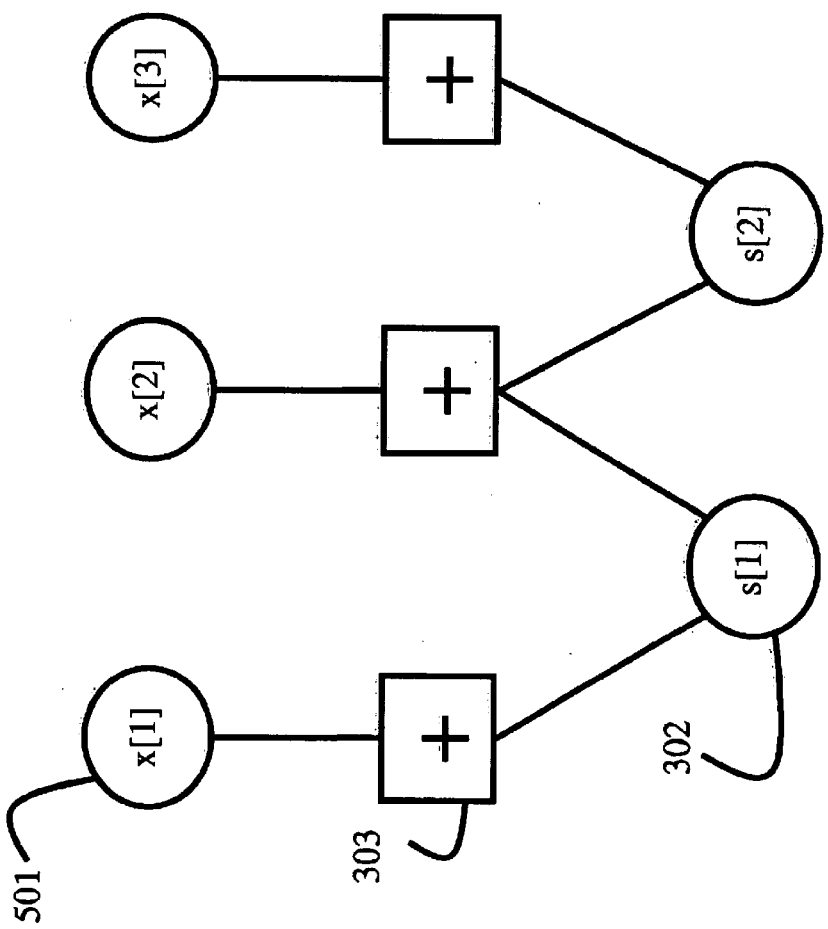
FIG. 6 is a sparse generator factor graph used by the invention.

FIG. 6 shows an example sparse generator factor graph 600 corresponding to an LDGM code. Consider an $[N=3, k=2]_{q=2}$ code with a generator matrix $$G = \begin{pmatrix} 1 & 1 & 0 \\ 0 & 1 & 1 \end{pmatrix}. \quad (11)$$

Recall that the code word x[n] is determined from the information block s[a] according to equation (5). Writing out the resulting constraints explicitly, we have $$x[1]=s[1] \quad (12)$$

$$x[2]=s[1]+s[2] \quad (13)$$

$$x[3]=s[2]. \quad (14)$$

If we are using GF(2), then these constraints can also be written as $$x[1]+s[1]=0 \quad (15)$$

$$x[2]+s[1]+s[2]=0 \quad (16)$$

$$x[3]+s[2]=0. \quad (17)$$

These constraints are represented in the factor graph of FIG. 6. Note that this is a generator factor graph, because after the variable nodes s[1] and s[2], which correspond to the information block, are specified, the variable nodes x[1], x[2], and x[3] which correspond to a code word are determined uniquely.

In general, for the [N, k] LDGM code, we determine N constraint equations on N+k variables, i.e., N code word variables and k information symbol variables.

LDGM codes always have a generator factor graph representation, and the generator factor graph is always sparse because of the low-density property of the generator matrices of LDGM codes. Therefore, the LDGM codes are always SGFG codes.

The sparse generator factor graph representations of LDGM codes contain no state variables, but other codes, such as Reed-Muller codes, can be represented by sparse generator factor graphs that do contain state variables. SGFG codes that have SGFG representations containing state variables can be more appropriate for use in some quantization problems.

Selecting a Fixed Function Mapping Symbols into Sample Values

Next, we select 420 a fixed function 421 mapping symbols to sample. We write this function as y=Y(a), where a is a symbol, y is the corresponding sample, and Y(a) is the selected fixed mapping function 421.

For example, if q=4, and the samples of the input signal 501 are real numbers distributed between 0.0 and 1.0, then one possible function is Y('0')=0.125, Y('1')=0.375, Y('2')=0.625, Y('3')=0.875.

The best function depends on the distortion measure 419 and a probability distribution 418 of the input signal. In many cases, a good choice is to divide a range of possible values of the samples relatively evenly, so that no sample has a value that is too far from a value of the symbol to which the sample is mapped. Other functions can be more appropriate when the input probability distribution for signals or the distortion measure are skewed.

As another example of a mapping function, for the BEQ problem, where the samples take on three values '0', '1', and '*', and the symbols take the values '0' and '1', we simply map the symbol '0' to the sample value '0,' and the symbol '1' into the sample value '1.' We refer to this mapping as the "standard" mapping function for the BEQ.

Selecting a Decoding Method for the SGFG Code

Next, we select 430 a soft-input decoding method 431 for the selected SGFG code 411.

If an optimal soft-input decoding method is practical, then it can be used. One optimal soft-input decoding method checks all possible code words and selects the one with a lowest cost.

In many practical applications, the SGFG code N is very large, and the number of code words is too large for the optimal decoder. Therefore, a non-optimal soft-input decoder is used.

Several different non-optimal soft-input decoders are possible, depending on a trade-off between the complexity of the decoder and the cost of the code words that it produces. For example, a bit-flipping decoder is usually less complex. However, a belief propagation decoder usually outputs code words that have lower cost.

Selecting an Encoding Method for the SGFG Code

Next, if it is desired to reproduce the input signal, we select 440 an encoder 441 for the SGFG code 411. One way to do this is to determine a generator matrix for the code, and then use equation (5) to convert the information block to the code word.

Because of the definition of a generator factor graph, it is always possible to use the sparse generator factor graph, combined with a version of the well-known belief propagation method, itself to generate the encoder 441 for the SGFG code 411. This can be done using a version of the belief propagation method that only sends messages when a node is completely certain. We call such a belief propagation method a belief propagation method using "hard" messages.

To generate an encoder using an sparse generator factor graph and a belief propagation method using hard messages, one begins by setting the variable nodes that correspond to symbols of the information block symbols to their desired states. These nodes then send messages to connected factor nodes about their states, and those messages are processed by the factor nodes. The factor nodes, in turn, send messages to other variable nodes that have not yet determined their states. Those states can be determined from the nodes whose states are already known. The belief propagation iterates until all variable nodes in the factor graph are determined, including the variable corresponding to the desired code word.

General Functioning of the Quantizing and Reproduction Methods

After we have performed the above selections, the signal can be quantized and reproduced as shown in FIG. 5.

The basic idea of our invention is to use the decoder 431 for the SGFG code 411 for the quantization, and to use the encoder 441 for the SGFG code 411 for the reproduction.

Determining the Distortion Cost Function for the Input Signal

In the first step of quantizing the input signal x[n] 501, we determine 510 a soft-input cost function 511 using the input signal 501, the fixed mapping function 421 mapping symbols into sample values, and the known distortion measure 419.

The cost function 511 is determined sample-by-sample for all N samples in the input signal x[n] 501. For each sample of the input signal x[n], we determine the distortion cost for each possible symbol value a, by measuring the distortion cost with respect to x[n] of the mapped sample value y=Y(a) obtained from a.

As an example, suppose that we were dealing with the binary erasure quantization application, and we want to quantize the signal $\{1, *, 1, 0\}$. We use the distortion function for the BEQ problem given in equation (2) together with the standard fixed mapping 421 between symbols and sample values for the BEQ discussed previously. From the input signal, we determine that the cost of assigning the symbol '0' to the first bit is 1/4, while the cost of assigning the symbol '1' to the first bit is 0. Similarly, the cost of assigning either symbol to the second bit is zero. The over-all distortion cost function for this example, given this input signal is $[(1/4, 0), (0, 0), (1/4, 0), (0, 1/4)]$.

Applying the Soft-Input Decoder

Given the distortion cost function 511 and the soft input decoder 431 for the $[N,k]_q$ SGFG code 411, we now decode 520 the cost function 511 to an information block 531 that corresponds to a low cost code word of the code 411. If the decoder 431 is optimal, then, we decode to an information block corresponding to the lowest cost code word. The information block includes k symbols selected from the q-ary alphabet, as required. This information block is the output of the quantizer 500.

As an example, suppose that our quantization problem is a BEQ quantization problem, with N=4, k=2, and q=2. We use the $[N=4, k=2]_{q=2}$ SGFG code 411 with generator matrix $$G = \begin{pmatrix} 1 & 0 & 1 & 0 \\ 0 & 1 & 0 & 1 \end{pmatrix}, \quad (10)$$

and the decoding method used is optimal decoding.

If an input signal $\{1, *, 1, 0\}$ transforms to a distortion cost function of $[(1/4, 0), (0, 0), (1/4, 0), (0,1/4)]$, then the selected code has four code words: 0000, 0101, 1010, and 1111. The code words correspond to four information blocks 00, 01, 10 and 11, respectively.

Using the distortion cost function, the costs of the four code words are 2/4, 3/4, 0 and 1/4, respectively. Thus, the optimal decoder decodes to the information block 10, which corresponds to the code word 1010, which has a distortion cost of zero. Therefore, a quantizer using this error-correcting code and an optimal decoder quantizes the input signal $\{1,*,1,0\}$ to an information block 10.

Non-Optimal Soft Input Decoders

If N is so large that an optimal decoder cannot be used, we use a non-optimal decoder instead. One important requirement of any non-optimal decoder is that the decoder always outputs an information block corresponding to some code word, even if that code word is not the lowest-cost code word. A failure state is not acceptable.

It is preferred that the non-optimal decoder reliably outputs a low-cost code word, even if it is not the lowest cost code word. We now discuss bit-flipping decoders and belief propagation decoders, which have this property.

Bit-flipping Decoders

A relatively simple class of decoders which reliably output low-cost code words, are bit-flipping decoders. There are many possible bit-flipping decoders that can be used. As one example, consider the following bit-flipping decoder, which we refer to as a "zero-temperature bit-flipping decoder."

The decoder is initialized with a "provisional" information block t[a]. A code word y[n] corresponding to the information block can be obtained by using an encoder for the SGFG code. Each code word has a cost that can be determined using the distortion cost function. The cost of the initial code word is stored in a variable c.

At each iteration, the zero-temperature bit-flipping decoder selects an information symbol in a provisional information block at random, and tries to "flip" the symbol to another information symbol, also selected at random If the cost of the code word that corresponds to the newly obtained information block is lower than c, then the flip is accepted and the provisional information block t[a] is updated and the cost c is updated to the cost of the code word corresponding to the new state of t[a]. Otherwise, if the cost of the newly obtained code word is greater than c, then the flip is rejected.

Then, the decoder iterates, selecting another information symbol to try to flip at random. The decoder terminates after a predetermined number of iterations without succeeding in flipping any information symbol, and outputs the information block t[a].

Belief Propagation Decoders

Because the SGFG code has a sparse factor graph representations, belief propagation decoders can also be used effectively as soft-input decoders.

One important advantage of generator factor graphs as opposed to other factor graph representations of codes is that they permit one to immediately interpret any given state of a belief propagation decoder as the state of an information block. In particular, one needs to only look at the beliefs at the variable nodes corresponding to the information block to determine the state of the information block.

Reproduction Method

Recall that to reproduce the input signal, one needs to convert the string s[a] of k symbols 531 to an output signal z[n] 509 of N samples. Using the encoder 441 for the $[N,k]_q$ SGFG error-correcting code 411, we can transform the string s[a] 531 into a code word y[n] 541. Then, by assigning each possible q-ary symbol to a different sample value according to the fixed function 421, as described above, we can transform the code word y[n] 541 into the desired output signal z[n] 509, which is substantially similar to the input signal 501.

For example, the input signal has four samples in the form of real numbers ranging from 0.0 to 1.0. The input signal is quantized into a string of symbols, each symbol being two bits. For illustrative purposes, assume the $[N=4, k=2]_{q=2}$ SGFG code with a generator matrix $$G = \begin{pmatrix} 1 & 0 & 1 & 0 \\ 0 & 1 & 0 & 1 \end{pmatrix} \quad (9)$$

is used, and one begins with the quantized string $\{1, 0\}$. The encoder converts the input string into the codeword $\{1, 0, 1, 0\}$. Then, if we applied the rule that '0' symbols are converted to samples with value 0.25, and '1' symbols are converted to samples with value 0.75, then the reproduced output signal is $\{0.75, 0.25, 0.75, 0.25\}$.

EFFECT OF THE INVENTION

For the BEQ problem, a recommended approach is to use LDGM codes that are dual to the LDPC codes that are effective for BEC channel coding. If a belief propagation decoder on an LDPC codes achieves the Shannon limit in the large N limit for the BEC channel coding problem, then a belief propagation decoder on the dual code used as a quantizer also achieve the Shannon limit for the BEQ problem.

Empirical simulations back up this result: using longer and longer codes at rate ½, we are able to quantize closer and closer to the limit of 50% erasures with zero distortion.

Bit flipping decoders also are effective. For example, for the BSQ problem, using a rate ½ regular LDGM codes of length 1000 with a bit-flipping decoder, we are able to quantize at a distortion level of 0.14 compared to the theoretical limit of 0.11.

Although the invention has been described by way of examples of preferred embodiments, it is to be understood that various other adaptations and modifications may be made within the spirit and scope of the invention. Therefore, it is the object of the appended claims to cover al such variations and modifications as come within the true spirit and scope of the invention.

We claim:

1. A method for quantizing an input signal including N samples into a string of k symbols selected from a q-ary alphabet, comprising:

selecting an $[N,k]_q$ linear block error-correcting code having a sparse factor graph representation;

determining a cost function for the input signal using a selected mapping function from the symbols to the samples and a predetermined distortion measure; and decoding the cost function to an information block corresponding to a code word of the linear block error-correcting code, the code word having a low distortion cost, and the information block including the string of k symbols.

2. The method of claim 1, in which the code is an $[N, k]_q$ sparse generator factor graph code.

3. The method of claim 1, in which the code is a low-density generator matrix code.

4. The method of claim 1, in which the decoder is a soft-input decoding method.

5. The method of claim 1, in which the decoder is a belief propagation decoding method.

6. The method of claim 1, wherein the decoder is a bit-flipping decoding method.

7. The method of claim 1, further comprising a method for reproducing a minimally distorted version of the input signal from the string of k symbols, comprising:

encoding the string of k symbols into a reproduced code word of the code; and replacing symbols of the reproduced code word with samples according to the selected mapping function.

8. The method of claim 7, in which the encoding method is the belief propagation with hard messages for the sparse factor generator graph representing the code.

* * * * *